(12) United States Patent
Lu et al.

(10) Patent No.: US 11,335,648 B2
(45) Date of Patent: May 17, 2022

(54) SEMICONDUCTOR CHIP FABRICATION AND PACKAGING METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Li Hui Lu, Shanghai (CN); Chun Chao Fei, Shanghai (CN); Po Yuan Chiang, Shanghai (CN); Ya Ping Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 64 days.

(21) Appl. No.: 16/697,552

(22) Filed: Nov. 27, 2019

(65) Prior Publication Data

US 2020/0098704 A1 Mar. 26, 2020

Related U.S. Application Data

(63) Continuation of application No. 15/985,272, filed on May 21, 2018, now Pat. No. 10,522,479.

(30) Foreign Application Priority Data

May 22, 2017 (CN) .......................... 201710363969.9

(51) Int. Cl.
*H01L 23/00* (2006.01)
*H01L 21/768* (2006.01)
*H01L 21/56* (2006.01)

(52) U.S. Cl.
CPC .......... *H01L 23/562* (2013.01); *H01L 21/563* (2013.01); *H01L 21/76802* (2013.01);
(Continued)

(58) Field of Classification Search
CPC ................. H01L 23/562; H01L 21/563; H01L 21/76802
(Continued)

(56) References Cited

U.S. PATENT DOCUMENTS 5,943,597 A 8/1999 Kleffner et al.
6,239,486 B1 * 5/2001 Shimizu .............. H01L 23/3675
257/704
(Continued)

FOREIGN PATENT DOCUMENTS

CN 1523664 A 8/2004
CN 1906746 A 1/2007
(Continued)

*Primary Examiner* — Bo Fan
(74) *Attorney, Agent, or Firm* — Anova Law Group, PLLC

(57) ABSTRACT

A method for fabricating a semiconductor structure is provided. The method includes forming a semiconductor chip; providing a printed circuit board; and forming an adhesive layer between a connection surface of the semiconductor chip and the printed circuit board to bond the semiconductor chip with the printed circuit board. The semiconductor chip includes a plurality of cutting tracks intersected with each other to enclose an area having corner regions. The connection surface of the semiconductor chip includes a plurality of conductive bumps and a plurality of first openings are formed in each of the corner regions.

10 Claims, 7 Drawing Sheets

(52) U.S. Cl.
CPC ........ *H01L 21/76843* (2013.01); *H01L 24/11* (2013.01); *H01L 24/13* (2013.01); *H01L 24/14* (2013.01); *H01L 24/17* (2013.01); *H01L 24/05* (2013.01); *H01L 24/16* (2013.01); *H01L 24/32* (2013.01); *H01L 24/73* (2013.01); *H01L 24/92* (2013.01); *H01L 2224/0345* (2013.01); *H01L 2224/0401* (2013.01); *H01L 2224/0518* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05624* (2013.01); *H01L 2224/05647* (2013.01); *H01L 2224/05655* (2013.01); *H01L 2224/05666* (2013.01); *H01L 2224/05671* (2013.01); *H01L 2224/131* (2013.01); *H01L 2224/13082* (2013.01); *H01L 2224/13111* (2013.01); *H01L 2224/13116* (2013.01); *H01L 2224/13144* (2013.01); *H01L 2224/16227* (2013.01); *H01L 2224/2919* (2013.01); *H01L 2224/32225* (2013.01); *H01L 2224/73204* (2013.01); *H01L 2224/92125* (2013.01); *H01L 2924/15311* (2013.01); *H01L 2924/351* (2013.01); *H01L 2924/35121* (2013.01)

(58) Field of Classification Search
USPC .......................................... 257/737, 707, 622
See application file for complete search history.

(56) References Cited

U.S. PATENT DOCUMENTS

| | | |
|---|---|---|
| 2007/0013065 A1 | 1/2007 | Yuzawa et al. |
| 2007/0215985 A1* | 9/2007 | Chen ...................... H01L 23/42 257/622 |
| 2013/0181341 A1 | 7/2013 | Yu |

FOREIGN PATENT DOCUMENTS

| | | |
|---|---|---|
| CN | 101026107 A | 8/2007 |
| CN | 101110398 A | 1/2008 |
| CN | 101114622 A | 1/2008 |
| CN | 104008981 A | 8/2014 |
| CN | 204391083 U | 6/2015 |
| CN | 105633043 A | 6/2016 |

* cited by examiner

SEMICONDUCTOR CHIP FABRICATION AND PACKAGING METHODS THEREOF

CROSS-REFERENCES TO RELATED APPLICATIONS

This application is a continuation application of U.S. patent application Ser. No. 15/985,272, filed on May 21, 2018, which claims the priority of Chinese Patent Application No. CN201710363969.9, filed on May 22, 2017, the entire content of which is incorporated herein by reference.

FIELD OF THE DISCLOSURE

The present disclosure generally relates to the field of integrated circuits and, more particularly, relates to semiconductor chip, semiconductor structure including packaged semiconductor chip, and fabrication and packaging methods thereof.

BACKGROUND

Integrated circuit (IC) packaging technology is an essential step in the process to turn an IC chip into a practical electronic product. The IC packaging technology plays a number of roles, such as connecting the electronic modules, providing mechanical support, providing protection, etc., in the field of semiconductor manufacturing. Therefore, the IC packaging technology can significantly improve the reliability of the chip.

In response to the demands for high-performance IC packaging systems, flip-chip packaging has become the mainstream method for high-density IC packaging. In the meantime, the emergence of three-dimensional (3D) packaging also makes a higher packaging density possible for packaged structures. In IC packaging systems, because of the difference in the thermal expansion coefficients of the chip, the substrate, the solder ball, the filling material, and other materials, stress may be easily introduced into the structure during the packaging process, and thus cause undesired effects on the performance and the reliability of the formed semiconductor chip.

Therefore, improving the performance of packaged structures has become an urgent issue to be solved. The disclosed semiconductor structures, semiconductor chips, packaged structures, and fabrication and packaging methods thereof are directed to solve one or more problems set forth above and other problems in the art.

BRIEF SUMMARY OF THE DISCLOSURE

One aspect of the present disclosure provides a method for fabricating semiconductor structures. The method includes forming a semiconductor chip; providing a printed circuit board; and forming an adhesive layer between a connection surface of the semiconductor chip and the printed circuit board to bond the semiconductor chip with the printed circuit board. The semiconductor chip includes a plurality of cutting tracks intersected with each other to enclose an area having corner regions. The connection surface of the semiconductor chip includes a plurality of conductive bumps and a plurality of first openings are formed in each of the corner regions.

Another aspect of the present disclosure provides a semiconductor structure including a semiconductor chip. The semiconductor chip includes a substrate, a connection layer formed on the substrate, a plurality of conductive bumps formed on the connection layer, and a first passivation layer formed on the substrate and containing a plurality of first openings. The plurality of conductive bumps protrude from the first passivation layer through the plurality of first openings. The semiconductor structure also includes a second passivation layer formed on the first passivation layer and containing a plurality of second openings and a plurality of third openings. Each second opening is formed in a first opening, each conductive bump protrudes from the second passivation layer through a second opening, and each third opening is formed outside of the plurality of first openings to expose the first passivation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
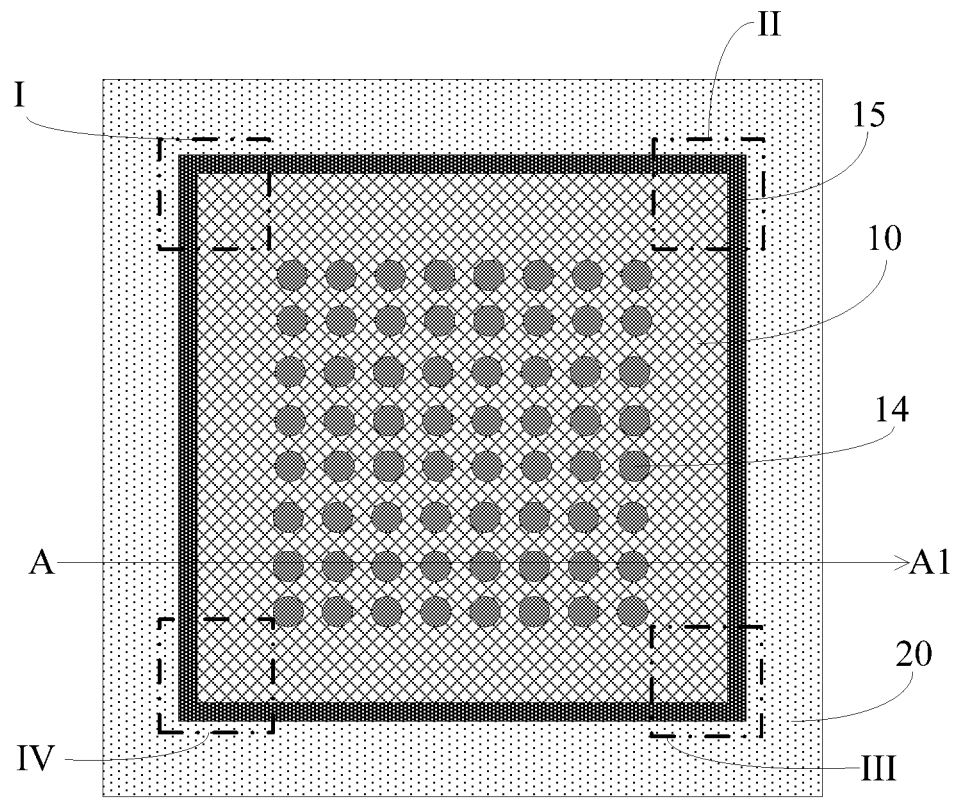
FIGS. 1-2 illustrate schematic views of a packaged structure.
Figure 2:
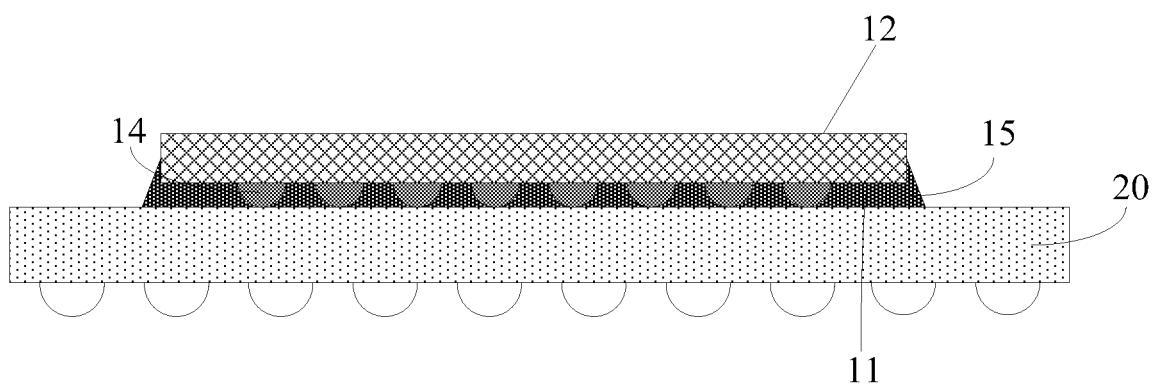

FIG. 1 illustrates a schematic top view of a packaged structure, and FIG. 2 illustrates a schematic cross-section view of the packaged structure shown in FIG. 1 along an AA1 direction. Referring to FIGS. 1-2, the packaged structure includes a semiconductor chip 10 and a printed circuit board 20. The semiconductor chip 10 includes a first surface 11 and, opposite to the first surface 11, a second surface 12. The packaged structure also includes a plurality of conductive bumps 14 formed on the first surface 11, and an adhesive layer 15 formed between the first surface and the printed circuit board 20.

Referring to FIG. 1, the packaged structure formed from the semiconductor chip 10 includes four corners, namely, regions I, region II, region III, and region IV. For the four corner regions, the adhesion strength between the adhesive layer and the chip is not uniform, which may easily cause delamination, and thus cause undesired effect on the performance and the reliability of the semiconductor chip.

Figure 3:
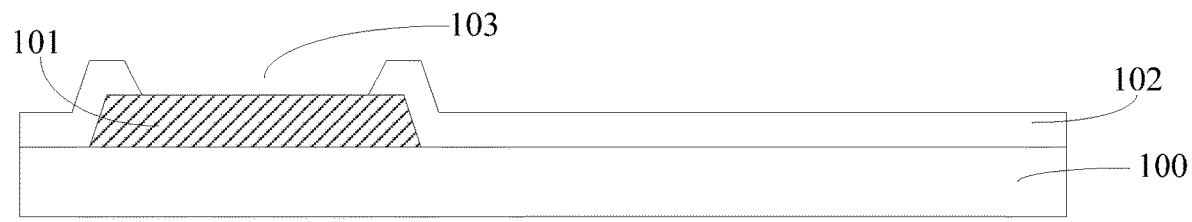
FIGS. 3-5 and FIGS. 8-11 illustrate schematic views of structures at certain stages of an exemplary fabrication method for a semiconductor structure consistent with some embodiments of the present disclosure.
Figure 4:
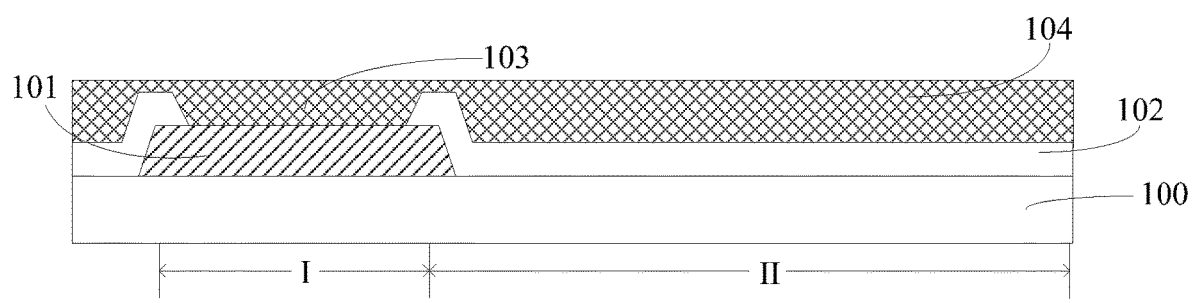
Figure 5:
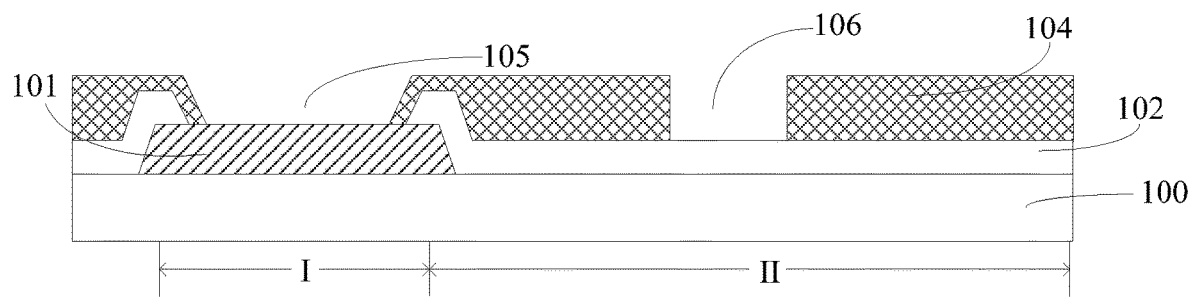
Figure 6:
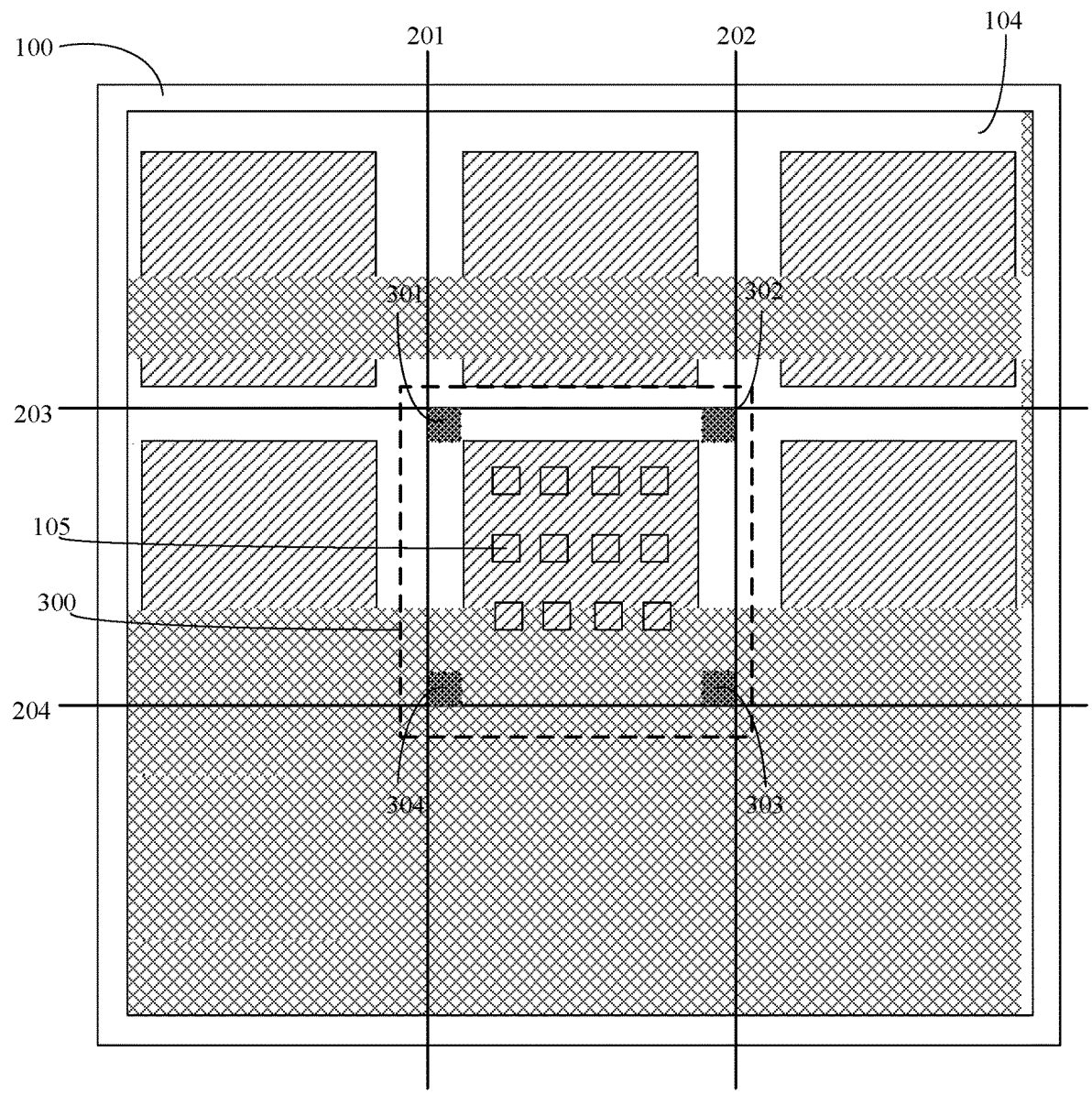
FIG. 6 illustrates a schematic top view of the semiconductor structure shown in FIG. 5.
Figure 7:
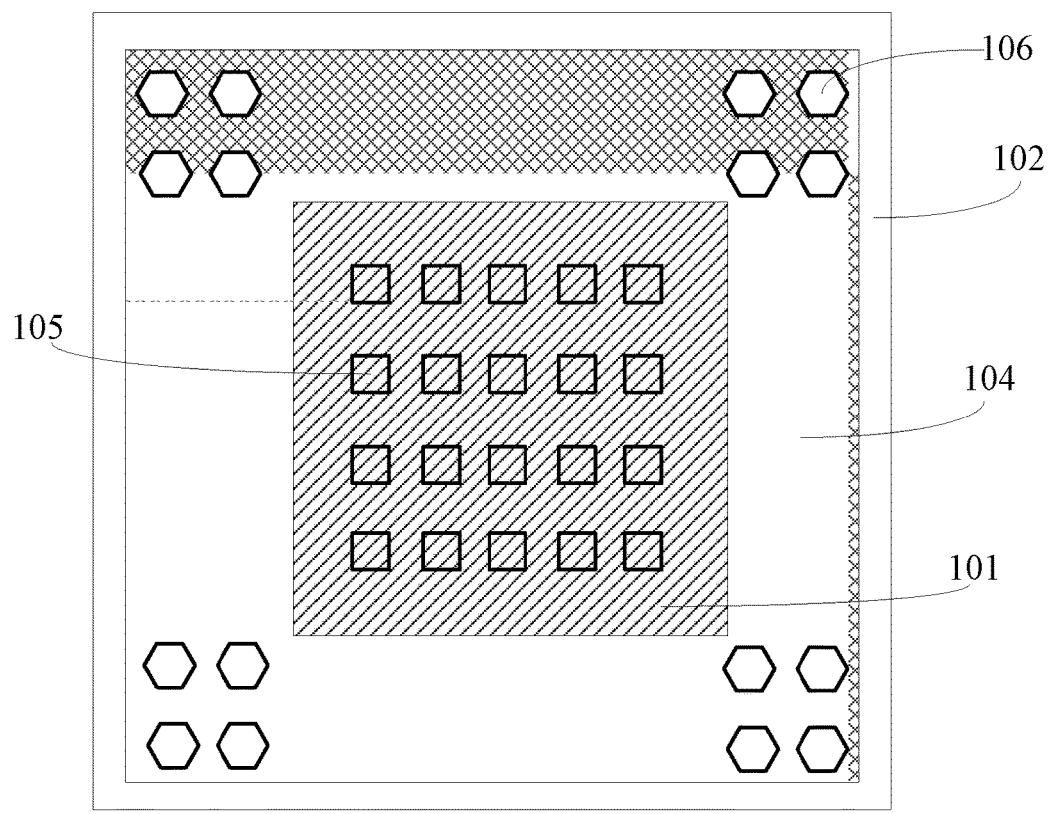
FIG. 7 illustrates a schematic enlarged view of a framed region in the semiconductor structure shown in FIG. 6.
Figure 14:
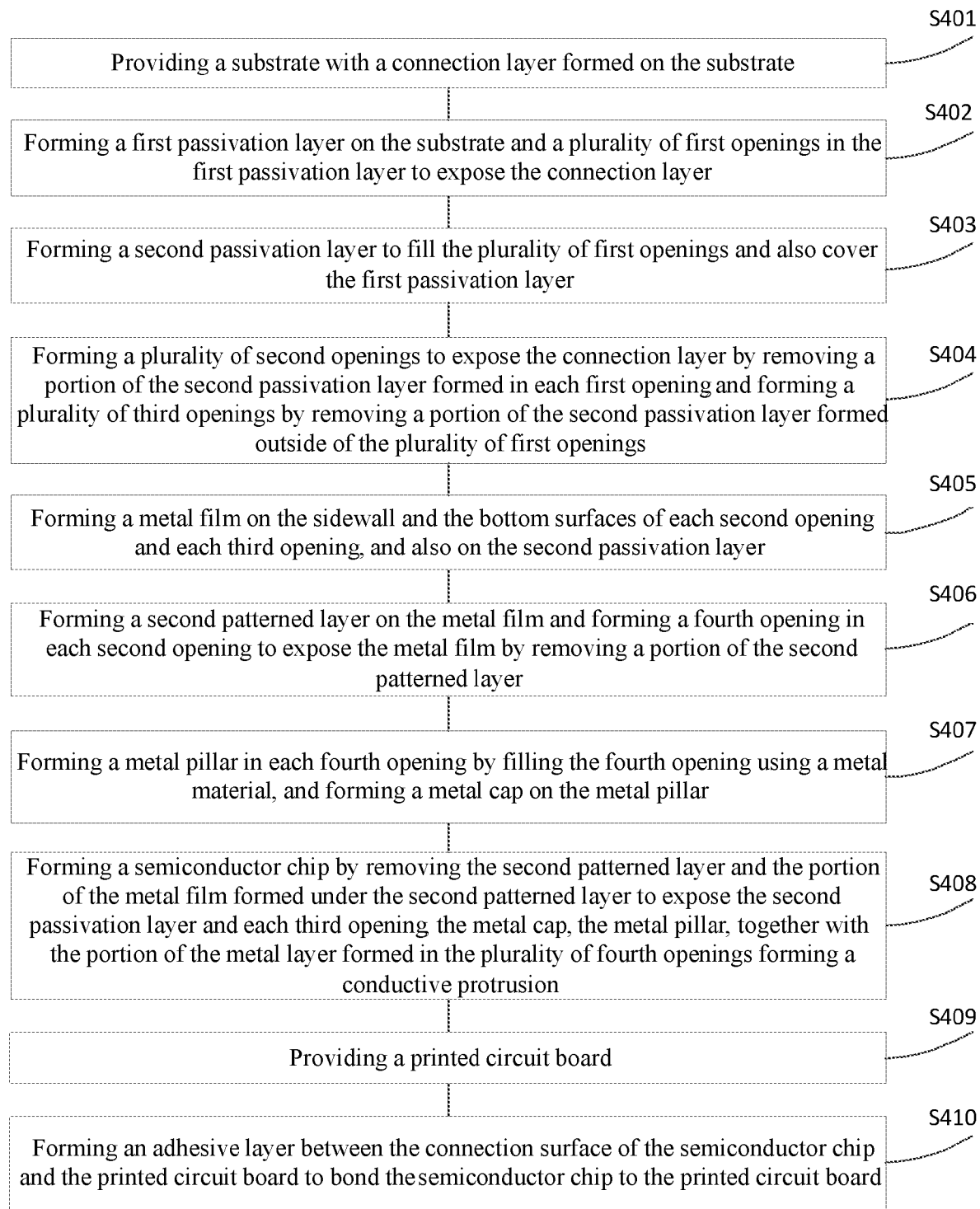
FIG. 14 illustrates a flowchart of an exemplary method for fabricating a semiconductor structure consistent with some embodiments of the present disclosure.

The present disclosure provides a method for fabricating semiconductor structures. FIG. 14 illustrates a flowchart of an exemplary method for fabricating a semiconductor structure consistent with some embodiments of the present disclosure. FIGS. 3-5 and FIGS. 8-11 illustrate schematic views of semiconductor structures at certain stages of the exemplary fabrication method. Moreover, FIG. 6 illustrates a schematic top view of the semiconductor structure shown in FIG. 5, and FIG. 7 illustrates a schematic enlarged view of a framed region in the semiconductor structure shown in FIG. 6.

Referring to FIG. 14, the method for fabricating semiconductor structures may include fabricating a semiconductor chip. At the beginning of the fabrication process, a substrate may be provided, and a connection layer may be formed on the substrate (S401). FIG. 3 shows a schematic cross-section view of a portion of a semiconductor structure consistent with some embodiments of the present disclosure.

Referring to FIG. 3, a substrate 100 including a connection layer 101 formed on the substrate 100 may be provided. The connection layer 101 may include a plurality of discrete regions. For illustrative purpose, only one of the discrete regions of the connection layer 101 is shown as an example in FIG. 3 to primarily describe the fabrication method, although any number of the discrete regions of the connection layer may be included according to various embodiments of the present disclosure.

In one embodiment, the semiconductor structure may also include a plurality of circuit patterns formed in the substrate 100. The plurality of circuit patterns may be used to realize the functions of the circuits. The plurality of discrete regions of the connection layer 101 may be used to electrically connect the plurality of circuit patterns.

In one embodiment, the process to form the connection layer 101 may include forming a connection material layer on the substrate 100 and then patterning the connection material layer to form the connection layer 101. In one embodiment, the connection layer 101 may be made of Al. In other embodiments, the connection layer may be made of one or more of Cu, Au, Mo, Ni, and Ti.

Further, referring to FIG. 14, a first passivation layer may be formed on the substrate, and a plurality of first openings may be formed in the first passivation layer to expose the connection layer (S402).

Referring to FIG. 3, a first passivation layer 102 may be formed on the substrate 100, and a plurality of first openings 103 may be formed in the first passivation layer 102 to expose a portion of the surface of the connection layer 101. The first passivation layer 102 may be used for electrically isolating the devices and the wires. Each first opening 103 may provide a process window for a subsequently-formed electrical connection structure.

In one embodiment, the first passivation layer 102 may be formed by a process including the following exemplary steps. A first passivation material layer may be formed on the substrate 100. The first passivation material layer may be patterned to form the first passivation layer 102. During the process to pattern the first passivation material layer, the plurality of first openings 103 may be simultaneously formed to expose the connection layer 101.

In one embodiment, the first passivation layer 102 may be made of silicon oxide. In other embodiments, the first passivation layer may be made of an inorganic glass, such as aluminum oxide, silicon nitride, phosphosilicate glass, borosilicate glass, borophosphosilicate glass, etc., or an organic polymer, such as polyimide, polysiloxane, silicone rubber, etc. In one embodiment, the first passivation material layer may be a $SiO_2$ film formed by a thermal growth method.

Further, returning to FIG. 14, a second passivation layer may be formed to fill the plurality of first openings and also cover the first passivation layer (S403). FIG. 4 illustrates a schematic cross-section view of a semiconductor structure processed from the semiconductor structure shown in FIG. 3.

Referring to FIG. 4, a second passivation layer 104 may be formed to fill the plurality of first openings 103 and also cover the first passivation layer 102. The portion of the second passivation layer 104 formed in the plurality of first openings 103 may correspond to a conductive bump region I and the portion of the second passivation layer 104 covering the first passivation layer 102 may correspond to a non-conductive bump region II.

The second passivation layer 104 may provide further protection for the substrate 100 and various dielectric films formed on the substrate 100. The conductive bump region I may be used to form a plurality of conductive bumps in a subsequent process, and the non-conductive bump region II may be used to provide a process window for a subsequently-formed third opening.

In one embodiment, the second passivation layer 104 may be made of phosphosilicate glass. In other embodiments, the second passivation layer may be made of an inorganic glass, such as silicon oxide, aluminum oxide, silicon nitride, phosphosilicate glass, borosilicate glass, borophosphosilicate glass, etc., or an organic polymer, such as polyimide, polysiloxane, silicone rubber, etc. In one embodiment, the second passivation layer 104 may be formed by a dry film lamination process or a coating process.

Further, returning to FIG. 14, a plurality of second openings may be formed to expose the connection layer by removing a portion of the second passivation layer formed in each first opening, and a plurality of third openings may be formed by removing a portion of the second passivation layer formed outside of the plurality of first openings (S404). FIG. 5 illustrates a schematic cross-section view of a semiconductor structure processed from the semiconductor structure shown in FIG. 4.

Referring to FIG. 5, a plurality of second openings 105 and a plurality of third openings 106 may be formed in the second passivation layer 104. Each second opening 105 may be formed in a first opening (referring to FIG. 3) to expose the connection layer 101. Each third opening 106 may be formed outside of the plurality of first openings 103, e.g., in the non-conductive bump region II.

Each second opening 105 may be used to form a conductive bump to electrically connect the circuit patterns. The plurality of third openings 106 may be used to improve the roughness of the second passivation layer 104 such that the semiconductor chip formed from the semiconductor structure may have enhanced roughness. Therefore, when subsequently filling the gaps between the semiconductor chip and a printed circuit board, the adhesion strength between the filling material and the semiconductor chip may be improved. As such, the formed packaged structure may be more stable, and the performance of the packaged structure may also be improved.

In one embodiment, the plurality of second openings 105 and the plurality of third openings 106 may be formed by a process including the following exemplary steps. The second passivation layer 104 may be formed to fill up the plurality of first openings 103 and also cover the first passivation layer 102. A first patterned layer may be formed on the second passivation layer 104. The first patterned layer may expose a portion of the second passivation layer 104 formed in each first opening 103 and also expose a portion of the second passivation layer 104 formed on the first passivation layer 102. Moreover, the second passivation layer 104 may be etched using the first patterned layer as an etch mask to form the plurality of second openings 105 and the plurality of third openings 106. Each second opening 105 may be formed in the conductive bump region I to expose a portion of the connection layer 101 in a corresponding first opening 103. In addition, each third opening 106 may be formed in the non-conductive bump region II to expose a portion of the surface of the first passivation layer 102. That is, each third opening 106 may be formed in the portion of the second passivation layer 104 outside of the plurality of first openings 103.

FIG. 6 illustrates a schematic top view of the semiconductor structure consistent with some embodiments of the present disclosure. Referring to FIG. 6, the semiconductor structure may include a plurality of second openings 105. Therefore, the semiconductor structure shown in FIG. 5 may correspond to only a portion of the semiconductor structure shown in FIG. 6. Moreover, the substrate 100 of the semiconductor structure may include a plurality of cutting tracks formed in the substrate 100. The plurality of cutting tracks may intersect with each other, and thus separate a portion of the substrate 100 into a plurality of discrete sub-regions.

In one embodiment, as shown in FIG. 6, the semiconductor structure may include a cutting track 201, a cutting track 202, a cutting track 203, and a cutting track 204. The cutting track 201, the cutting track 202, the cutting track 203, and the cutting track 204 may be intersected with one another to define a region 300. That is, the region 300 may be a sub-region of the substrate 100 defined (e.g., enclosed) by intersected cutting tracks. The intersected region may include corner regions formed by any two of the cutting track 201, the cutting track 202, the cutting track 203, and the cutting track 204. As shown in FIG. 6, the corner regions of the region 300 may include region 301, region 302, region 303, and region 304. That is, after cutting the substrate 100 through the cutting tracks, the semiconductor chip corresponding to the region 300 may include four corner regions, namely, region 301, region 302, region 303, and region 304. Accordingly, the plurality of third openings 106 may be formed in the corner regions shown in FIG. 6. In one embodiment, one or multiple third openings 106 may be formed in each corner region formed by two intersected cutting tracks.

As each third opening 106 is formed in a corner region of the semiconductor structure, the corner region of the semiconductor chip formed from the semiconductor structure may include at least one third opening 106. According to conventional packaged structures of semiconductor chips, the stress at a corner region of a packaged structure is relatively large, and thus may easily cause delamination. According to the present disclosure, by introducing the plurality of third openings 106, the adhesion strength between the filling material and the semiconductor chip may be improved. As such, the delamination may be avoided, and the performance of the formed packaged structure may be improved.

FIG. 7 illustrates a schematic enlarged top view of a framed region 300 in the semiconductor structure shown in FIG. 6. Referring to FIG. 7, the opening width of each third opening 106 may not be too small. When the opening width of the third opening 106 is too small, filling the third opening 106 with a filling material in a subsequent process may become difficult, and thus the adhesion strength between the filling material and the semiconductor chip may be undesired. Therefore, in one embodiment, the opening width of each third opening 206 may be larger than or equal to about 20 μm. Moreover, the opening width of each third opening 106 may not be too large either. When the opening width of the third opening 106 is too large, the roughness of the semiconductor chip may not be sufficient enough to improve the adhesion strength between the filling material and the semiconductor chip. Therefore, in one embodiment, the opening width of each third opening 106 may be smaller than or equal to ⅓ of the area size of the framed region 300 (as shown in FIG. 6).

The shape of the cross section of the third opening 106 in a direction parallel to the surface of the substrate 100 may need to disperse the stress of the filling material and may also be fabricated by a relatively simple process. Therefore, in one embodiment, the cross section of the third opening in the direction parallel to the surface of the substrate 100 may have a regular hexagonal shape. In other embodiments, the cross section of the third opening may have a circular shape, a regular polygonal shape, or an irregular polygonal shape.

The depth of the third opening 106 may not be too large or too small. When the depth of the third opening 106 is too large, the third opening 106 may penetrate through the first passivation layer 102 such that the protection of the first passivation layer 102 on the substrate 100 may be reduced, and the performance of the semiconductor structure may be affected. When the depth of the third opening 106 is too small, the roughness of the second passivation layer 104 may not be significantly improved. Therefore, the bottom surface of the third opening 106 may be formed in the first passivation layer 102 or may be formed on the surface of the first passivation layer 102. In one embodiment, the depth of each third opening 106 may be larger than or equal to about 5 μm.

Figure 8:
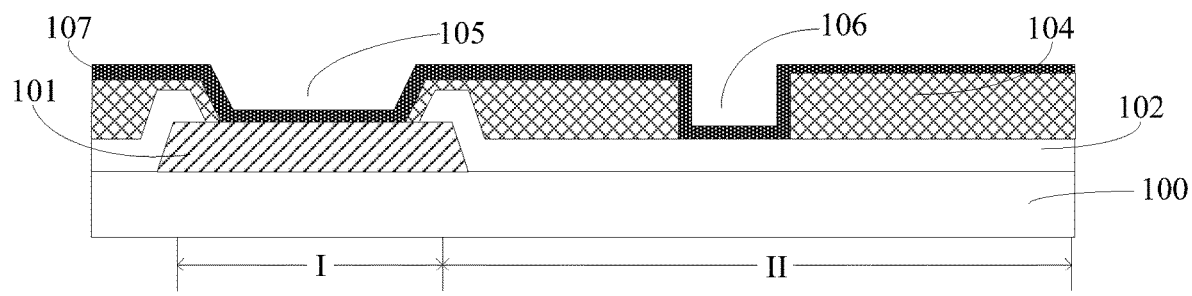

Further, returning to FIG. 14, a metal film may be formed on the sidewall and the bottom surfaces of each second opening and each third opening, and also on the second passivation layer (S405). FIG. 8 illustrates a schematic cross-section view of a semiconductor structure consistent with some embodiments of the present disclosure.

Referring to FIG. 8, a metal film 107 may be formed on the sidewall and the bottom surfaces of each second opening 105. The metal film 107 may also cover the surface of the second passivation layer 104 as well as the sidewall and the bottom surfaces of each third opening 106.

The metal film 107 may be used to form a under bump metal (UBM) layer for a conductive bump. The UBM layer formed from the metal film 107 may demonstrate desired adhesion ability to bond the connection layer 101. In addition, the UBM layer may effectively prevent interdiffusion between the connection layer 101 and the conductive bump, and between the substrate 100 and the conductive bump.

In one embodiment, the metal film 107 may be made of copper. In other embodiments, the metal film may be made of aluminum, titanium, chromium, nickel, or any other appropriate metal material. In one embodiment, the metal film 107 may be formed by a sputtering process. The metal film may have a single-layer structure or a multiple-layer structure.

Figure 9:
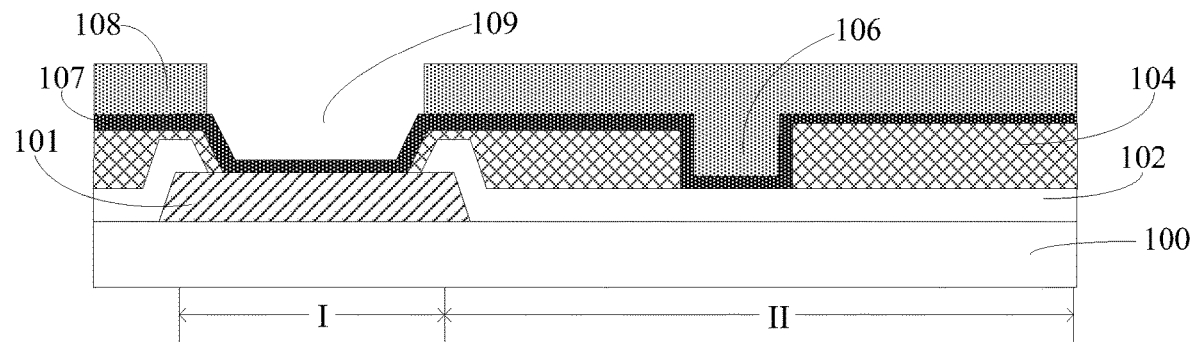

Further, returning to FIG. 14, a second patterned layer may be formed on the metal film, and a fourth opening may be formed to expose the metal film in each second opening by removing a portion of the second patterned layer (S406). FIG. 9 illustrates a schematic cross-section view of a semiconductor structure consistent with some embodiments of the present disclosure.

Referring to FIG. 9, a second patterned layer 108 may be formed on the metal film 107. A fourth opening 109 may be formed to expose the metal film 107 in each second opening 105 (referring to FIG. 8) by removing the portion of the second patterned layer 108 in the second opening 105. The fourth opening 109 may provide a process window for a subsequently-formed conductive bump.

Figure 10:
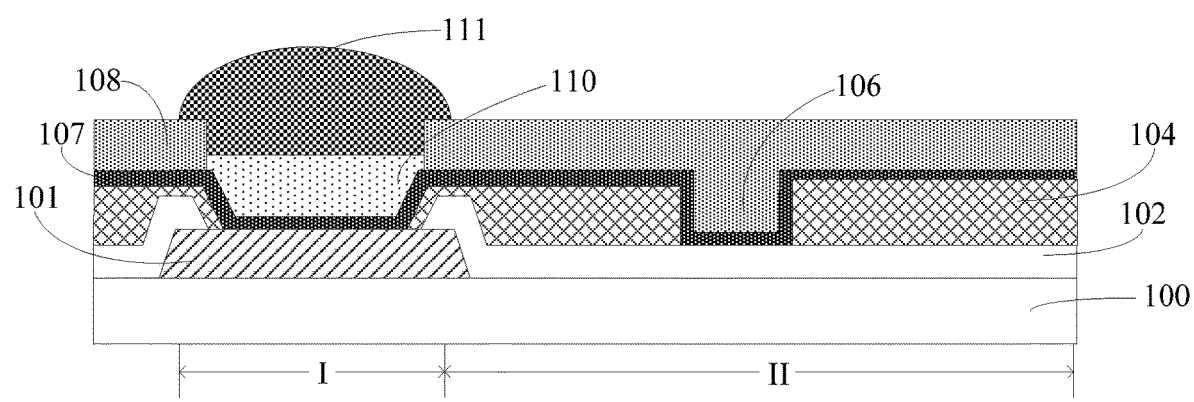

Further, returning to FIG. 14, a metal pillar may be formed in each fourth opening by filling a metal material into the fourth opening, and a metal cap may be formed on the metal pillar (S407). FIG. 10 illustrates a schematic cross-section view of a semiconductor structure consistent with some embodiments of the present disclosure.

Referring to FIG. 10, a metal pillar 110 may be formed in each fourth opening 109 (referring to FIG. 9) by filling the fourth opening 109 with a metal material, and a metal cap 111 may be formed on the metal pillar 110.

In one embodiment, both the metal pillar 110 and the metal cap 111 may be made of Au. In other embodiments, the metal pillar and the metal cap may be made of Sn/Pb alloy or a lead-free soldering material. In one embodiment, the metal pillar 110 and the metal cap 111 may be formed by a process using an electroplating method.

Figure 11:
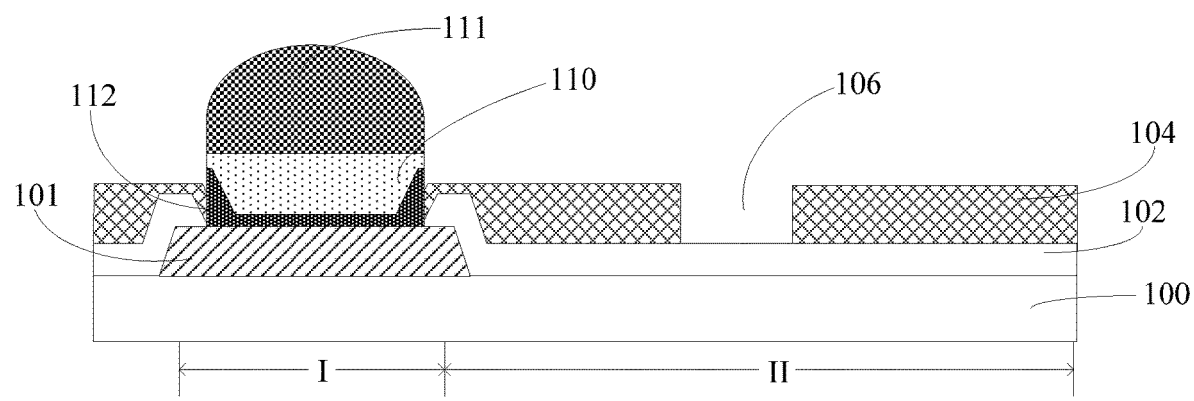

Further, returning to FIG. 14, a semiconductor chip may be formed by removing the second patterned layer and the portion of the metal film formed under the second patterned layer to expose the second passivation layer and each third opening, the metal cap, the metal pillar, and the portion of the metal layer formed in each fourth opening together forming a conductive bump (S408). FIG. 11 illustrates a schematic cross-section view of a semiconductor structure consistent with some embodiments of the present disclosure.

Referring to FIG. 11, the second patterned layer 108 (referring to FIG. 10) and the portion of the metal film 107 (referring to FIG. 10) formed under the second patterned layer 108 may be removed to expose the second passivation layer 104 as well as the third opening 106. After removing the portion of the metal film 107 formed under the second patterned layer 108, the metal cap 111, the metal pillar 110, and the remaining portion of the metal film 107 in each fourth opening 109 may together form a conductive bump. Accordingly, the remaining portion of the metal film 107 formed in the fourth opening 109 may become a UBM layer 112 of the conductive bump. Therefore, corresponding to a plurality of fourth openings 109, a plurality of conductive bumps may be formed in the disclosed semiconductor structure. The plurality of conductive bumps may be used to electrically connect the printed circuit board.

Moreover, during the formation process of the conductive bumps in the second openings 105, the conductive bumps may be formed only in the plurality of second openings 105. That is, the conductive bumps may not be formed in any third opening 106.

As such, as shown in FIG. 11, a semiconductor chip consistent with various embodiments of the present disclosure may be fabricated. The semiconductor chip may include a connection surface, and the plurality of conductive bumps 400, and the plurality of third openings 106 may be formed on the connection surface of the semiconductor chip.

Further, returning to FIG. 14, a printed circuit board may be provided (S409). The printed circuit board may have any appropriate design according to the actual needs of the application. In one embodiment, the printed circuit board may include a substrate and a plurality of conductive balls protruding from the substrate. In a subsequent process, the printed circuit board may be bonded to the semiconductor chip (referring to FIG. 11) to form a semiconductor structure.

Figure 13:
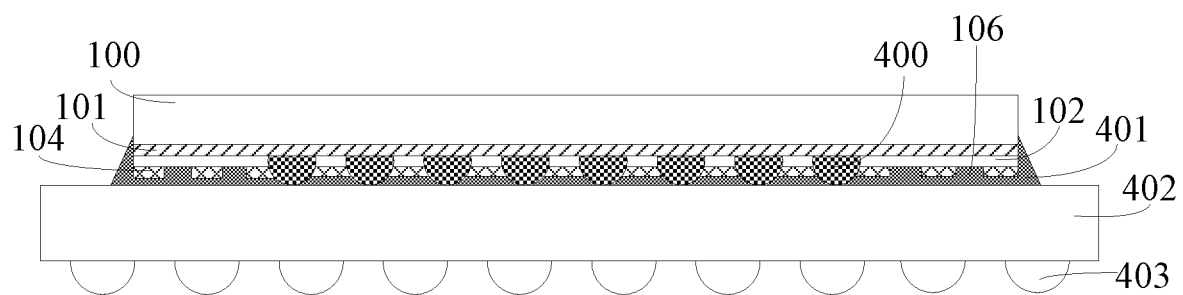
FIG. 13 illustrates a schematic cross-section view of a packaged structure consistent with some embodiments of the present disclosure.

Returning to FIG. 14, the semiconductor chip and the printed circuit board may be bonded together through an adhesive layer formed between the connection surface of the semiconductor chip and the printed circuit board (S410). FIG. 13 illustrates a schematic cross-section view of a packaged structure after bonding the printed circuit board to the semiconductor chip according to various embodiments of the present disclosure.

Referring to FIG. 13, an adhesive layer 401 may be formed between the connection surface of the semiconductor chip and the printed circuit board. The adhesive layer 401 may bond the connection surface of the semiconductor chip to the printed circuit board to form a packaged structure.

In one embodiment, each conductive bump 400 of the semiconductor chip may include a metal cap 111, a metal pillar 110, and a UBM layer 112. The printed circuit board may include a substrate 402 and a plurality of conductive balls 403. The adhesive layer 401 may be made of an epoxy glue.

The process to form the adhesive layer 401 between the connection surface of the semiconductor chip and the printed circuit board may include the following exemplary steps. The semiconductor chip may be aligned with the printed circuit board such that each conductive bump 400 of the semiconductor chip may be aligned with a desired pattern on the printed circuit board. The semiconductor chip and the printed circuit board may be soldered together. Further, after the semiconductor chip and the printed circuit board are soldered together, an under-filling process may be performed on the soldered structure to form the adhesive layer 401 between the connection surface of the semiconductor chip and the printed circuit board.

According to the disclosed method, a plurality of third openings 106 are formed in the second passivation layer to increase the roughness of the second passivation layer 104. Therefore, during the process to fill the gaps between the semiconductor chip and the printed circuit board, the adhesion strength between the filling material and the semiconductor chip may be improved. As such, the formed packaged structure may be more reliable, and may demonstrate improved performance. In addition, the plurality of the third openings in the second passivation layer are formed in the corner regions of the semiconductor chip. According to conventional packaging methods, the stress at a corner region of a packaged structure is relatively large, and thus may easily cause delamination. As a comparison, by introducing the plurality of openings in the corner regions, the adhesion strength between the filling material and the semiconductor chip may be improved. As such, the delamination may be avoided, and the performance of the formed packaged structure may be improved.

Further, the present disclosure also provides a semiconductor structure. The semiconductor structure may include a semiconductor chip. FIG. 11 illustrates a schematic cross-section view of a portion of an exemplary semiconductor chip consistent with some embodiments of the present disclosure.

Referring to FIG. 11, the semiconductor chip may include a substrate 100 and a connection layer 101 formed on the substrate 100. The connection layer 101 may include a plurality of discrete regions. For illustration purpose, only one of the discrete regions of the connection layer 101 is shown as an example in FIG. 11. Moreover, the semiconductor chip may also include a plurality of conductive bumps formed on the connection layer 101, and a first passivation layer 102 formed on the substrate 100 between neighboring conductive bumps. Each conductive bump may be located in a first opening (not labeled) formed in the first passivation layer 102 during the fabrication process. The semiconductor chip may further include a second passivation layer 104 formed on the first passivation layer 102. Corresponding to the location of each first opening formed in the first passivation layer 102, a second opening (not labeled) may be formed in the second passivation layer 104 such that a corresponding conduction bump may protrude from the second passivation layer 104. Moreover, the semiconductor chip may also include a plurality of third openings 106 formed in the portion of the second passivation layer 104 outside of the plurality of first openings 103.

In one embodiment, the opening width of each third opening 106 may be larger than or equal to about 20 μm. In addition, the opening width of each third opening 106 may be smaller than or equal to about ⅓ of the area size (covering every third opening 106 in one corner region) of a corner region of the semiconductor chip.

Moreover, each conductive bump may include a UBM layer 112 formed on a portion of the top surface of the connection layer 101 and the sidewall surfaces of the first opening (then the second opening), a metal pillar 110 formed on the UBM layer 112, and a metal cap 111 formed on the metal pillar 110. The UBM layer 112 may be made of copper. In other embodiments, the metal film may be made of aluminum, titanium, chromium, nickel, or any other appropriate metal material.

Figure 12:
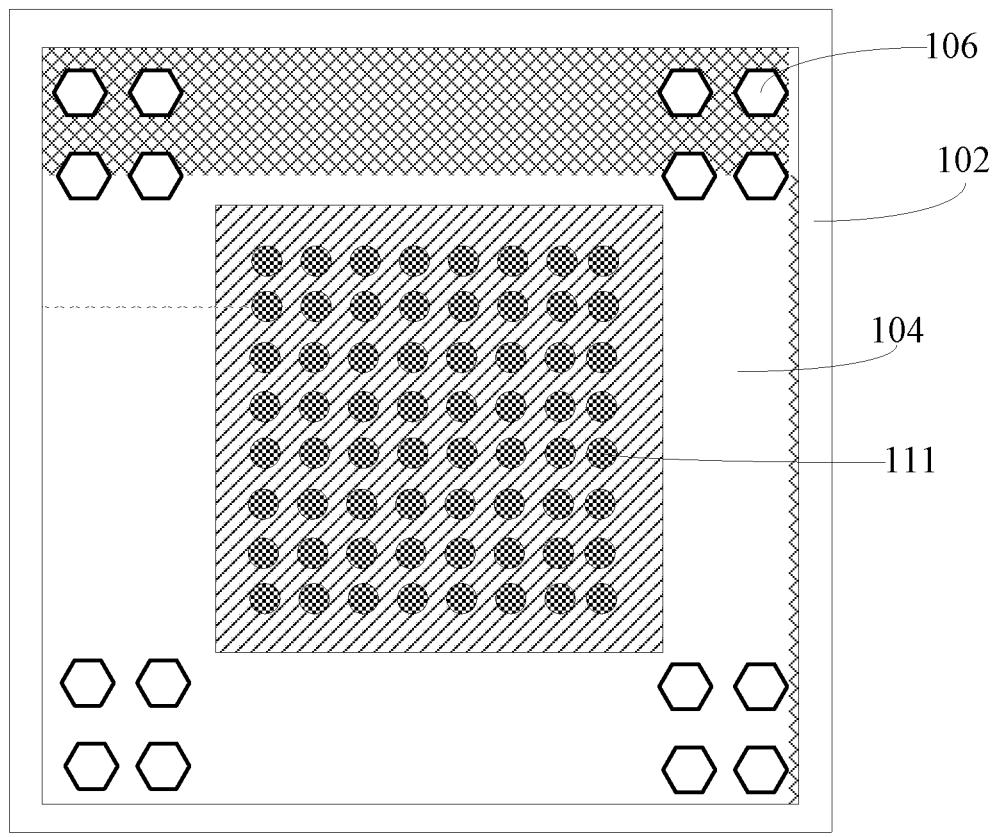
FIG. 12 illustrates a schematic view of an exemplary semiconductor chip consistent with some embodiments of the present disclosure.

FIG. 12 illustrates a schematic top view of the semiconductor structure consistent with some embodiments of the present disclosure. Referring to FIG. 12, in one embodiment, the cross section of each third opening 106 in a direction parallel to the surface of the substrate 100 may have a regular hexagonal shape. In other embodiments, the cross section of each third opening 106 may have a circular shape, a regular polygonal shape, or an irregular polygonal shape.

In one embodiment, a plurality of third openings 106 may be formed in the corner regions of the semiconductor chip. The advantage of forming the third openings 106 in the corner regions of the semiconductor chip may be referred to the corresponding discussion in the above embodiments.

In one embodiment, each corner region of the semiconductor chip may include one or multiple third openings 106. That is, at least one opening 106 may be formed in each corner region.

In one embodiment, the first passivation layer 102 may be made of silicon oxide. In other embodiments, the first passivation layer may be made of aluminum oxide, silicon nitride, phosphosilicate glass, borosilicate glass, borophosphosilicate glass, polyimide, polysiloxane, silicone rubber, etc.

Moreover, the second passivation layer 104 may be made of phosphosilicate glass. In other embodiments, the second passivation layer may be made of silicon oxide, aluminum oxide, silicon nitride, phosphosilicate glass, borosilicate glass, borophosphosilicate glass, polyimide, polysiloxane, silicone rubber, etc.

In one embodiment, the bottom surface of each third opening 106 may be formed in the first passivation layer 102 or may be formed on the surface of the first passivation layer 102.

Further, the semiconductor structure may include a printed circuit board bonded on the connection surface of the semiconductor chip through an adhesive layer. That is, the semiconductor structure may be a packaged structure including the semiconductor chip and a printed circuit board. The semiconductor structure shown in FIG. 13 is an exemplary packaged structure consistent with some embodiments of the present disclosure.

Referring to FIG. 13, the semiconductor structure (i.e., packaged structure) may include the semiconductor chip (referring to FIG. 11) described above and a printed circuit board. The semiconductor chip may include a connection surface, and a plurality of conductive bumps 400 and a plurality of third openings 106 may be formed on the connection surface of the semiconductor chip. The printed circuit board may include a substrate 402 and a plurality of conductive balls 403. The semiconductor structure (i.e., the packaged structure) may further include an adhesive layer 401 formed between the connection surface of the semiconductor chip and the printed circuit board. The adhesive layer 401 may be made of an epoxy glue.

The detailed description of the semiconductor structure, the conductive bumps, and the printed circuit board may be referred to the corresponding discussion in the above embodiments. Specifically, the semiconductor chip may include a plurality of third openings 106 formed in the corner regions of the semiconductor chip. The advantage of forming the third openings 106 in the corner regions of the semiconductor chip may be referred to the corresponding discussion in the above embodiments.

According to the disclosed semiconductor structure, a plurality of third openings are formed in the second passivation layer of the semiconductor chip to improve the roughness of the second passivation layer. Therefore, during the process to fill the gaps between the semiconductor chip and the printed circuit board, the adhesion strength between the filling material and the semiconductor chip may be improved. As such, the formed packaged structure may be more reliable, and may demonstrate improved performance. In addition, the plurality of the third openings in the second passivation layer are formed in the corner regions of the semiconductor chip. According to conventional packaged structures, the stress at a corner region of a packaged structure is relatively large, and thus may easily cause delamination. As a comparison, by introducing the plurality of openings in the corner regions, the adhesion strength between the filling material and the semiconductor chip may be improved. As such, the delamination may be avoided, and the performance of the formed packaged structure may be improved.

Compared to conventional semiconductor structures and fabrication methods, the disclosed semiconductor structures and corresponding fabrication methods may demonstrate the following advantages.

According to the disclosed semiconductor structures and fabrication methods, a plurality of third openings are formed in the second passivation layer to improve the roughness of the second passivation layer. Therefore, during the process to fill the gaps between the semiconductor chip and the printed circuit board, the adhesion strength between the filling material and the semiconductor chip may be improved. As such, the formed packaged structure may be more reliable, and may demonstrate improved performance.

Further, the plurality of the third openings in the second passivation layer are formed in the corner regions of the semiconductor chip. According to conventional packaged structures, the stress at a corner region of a packaged structure is relatively large, and thus may easily cause delamination. As a comparison, by introducing the plurality of openings in the corner regions, the adhesion strength between the filling material and the semiconductor chip may be improved. As such, the delamination may be avoided, and the performance of the formed packaged structure may be improved.

The above detailed descriptions only illustrate certain exemplary embodiments of the present invention, and are not intended to limit the scope of the present invention. Those skilled in the art can understand the specification as whole and technical features in the some embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   forming a semiconductor chip;
   providing a printed circuit board; and
   forming an adhesive layer between the semiconductor chip and the printed circuit board to bond the semiconductor chip with the printed circuit board, wherein:
   the semiconductor chip includes a plurality of cutting tracks intersected with each other to enclose an area having corner regions, and
   the semiconductor chip includes a plurality of conductive bumps and a plurality of first openings are formed in each of the corner regions, wherein forming the semiconductor chip, comprising:
   providing a substrate;
   forming a connection layer on the substrate;
   forming a first passivation layer on the substrate, the first passivation layer containing a plurality of second openings to expose the connection layer;
   forming a second passivation layer to cover the first passivation layer and fill the plurality of second openings;
   forming a plurality of third openings and the plurality of first openings in the second passivation layer; and
   forming a conductive bump in each third opening.

2. The method according to claim 1, wherein:
   each third opening is formed in a second opening to expose the connection layer, and each first opening is formed outside of the plurality of second openings to expose the first passivation layer.

3. The method according to claim 1, wherein:
   a cross section of each first opening in a direction parallel to a surface of the substrate has a regular hexagonal shape.

4. The method according to claim 1, wherein:
   the plurality of cutting tracks is intersected with each other in the substrate.

5. The method according to claim 1, wherein:
   a bottom surface of each first opening is leveled with or lower than a top surface of the first passivation layer.

6. The method according to claim 1, wherein:
   the second passivation layer is made of one of silicon oxide, aluminum oxide, silicon nitride, phosphosilicate glass, borosilicate glass, borophosphosilicate glass, polyimide, polysiloxane, and silicone rubber.

7. The method according to claim 1, wherein forming the second passivation layer and forming the plurality of third openings and the first openings in the second passivation layer include:
   forming the second passivation layer to fill the plurality of second openings and also cover the first passivation layer;
   forming a first patterned layer on the second passivation layer, the first patterned layer exposing a portion of the second passivation layer formed in each second opening and a portion of the second passivation layer formed outside of the plurality of second openings; and
   performing an etching process on the second passivation layer using the first patterned layer as an etch mask to form the plurality of third openings and the plurality of first openings.

8. The method according to claim 1, forming the conductive bump in each third opening includes:
   forming a metal film on sidewall and bottom surfaces of the plurality of third openings, wherein the metal film also covers the second passivation layer as well as sidewall and bottom surfaces of the plurality of first openings;
   forming a second patterned layer on the metal film, wherein a fourth opening is formed in the second patterned layer to expose the metal film in the third opening;
   forming a metal pillar in the fourth opening by filling a metal material into the fourth opening;
   forming a metal cap on top of the metal pillar;
   removing the second patterned layer and a portion of the metal film formed under the second patterned layer to expose the second passivation layer and the plurality of first openings, wherein:
   a portion of the metal film formed in the fourth opening becomes a under bump metal (UBM) layer; and
   the metal cap, the metal pillar, and the UBM layer together form the conductive bump.

9. The method according to claim 1, wherein forming the adhesive layer includes:
   aligning the semiconductor chip with the printed circuit board;
   soldering the semiconductor chip and the printed circuit board together; and
   performing an under-filling process to form the adhesive layer between the semiconductor chip and the printed circuit board.

10. The method according to claim 9, wherein aligning the semiconductor chip with the printed circuit board includes aligning each of plurality of conductive bumps with a pattern on the printed circuit.

* * * * *